(12) United States Patent
Ahmad et al.

(10) Patent No.: US 8,766,697 B2
(45) Date of Patent: Jul. 1, 2014

(54) LEVEL SHIFTING CIRCUIT WITH ADAPTIVE FEEDBACK

(75) Inventors: Adeel Ahmad, Uttar Pradesh (IN); Chandrajit Debnath, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/563,869

(22) Filed: Aug. 1, 2012

(65) Prior Publication Data

US 2014/0035672 A1   Feb. 6, 2014

(51) Int. Cl.
  *H03L 5/00*  (2006.01)
(52) U.S. Cl.
  USPC .......................................................... 327/333
(58) Field of Classification Search
  USPC .......................................................... 327/333
  See application file for complete search history.

(56) References Cited

U.S. PATENT DOCUMENTS 7,068,116 B2 * 6/2006 Kato et al. .................... 331/111

OTHER PUBLICATIONS

Koo, Kyoung-Hoi, et al: "A New Level-Up Shifter for High Speed and Wide Range Interface in Ultra Deep Sub-Micron," Mixed Signal Core P/T, Design Technology R&D Team, Samsung Electronics, 2005 IEEE, pp. 1063-1065.
Hass, K. Joe, et al: "Level Shifting Interfaces for Low Voltage Logic," NASA Insittute of Advanced Microelectronics, Microelectronics Research Center, University of New Mexico, 9th NASA Symposium on VLSI Design 2000, pp. 3.1.1 through 3.1.7.
Chavan, Ameet, et al: "Ultra Low Voltage Level Shifters to Interface Sub and Super Threshold Reconfigurable Logic Cells," Electrical and Computer Engineering Department, University of Texas at El Paso, IEEEAC paper #1345, Version 12, updated Dec. 17, 2007, pp. 1-6.

* cited by examiner

*Primary Examiner* — Daniel Rojas
(74) *Attorney, Agent, or Firm* — Gardere Wynne Sewell LLP

(57) ABSTRACT

An amplifier has a first pull-up path coupled between a voltage supply node and an output node, and a pull-down path coupled between the output node and a ground supply node. A second pull-up path is coupled between the voltage supply node and the output node. The second pull-up path is actuated by a feedback signal and biased by a biasing signal. An inverter circuit is operable to invert the signal at the amplifier output node to generate the feedback signal. A biasing circuit is configured to generate the biasing signal. The biasing circuit is configured to control a relative strength of the pull-down path to the second pull-up path, wherein the pull-down path is stronger than the second pull-up path in a manner that is consistently present over all PVT corners.

20 Claims, 3 Drawing Sheets

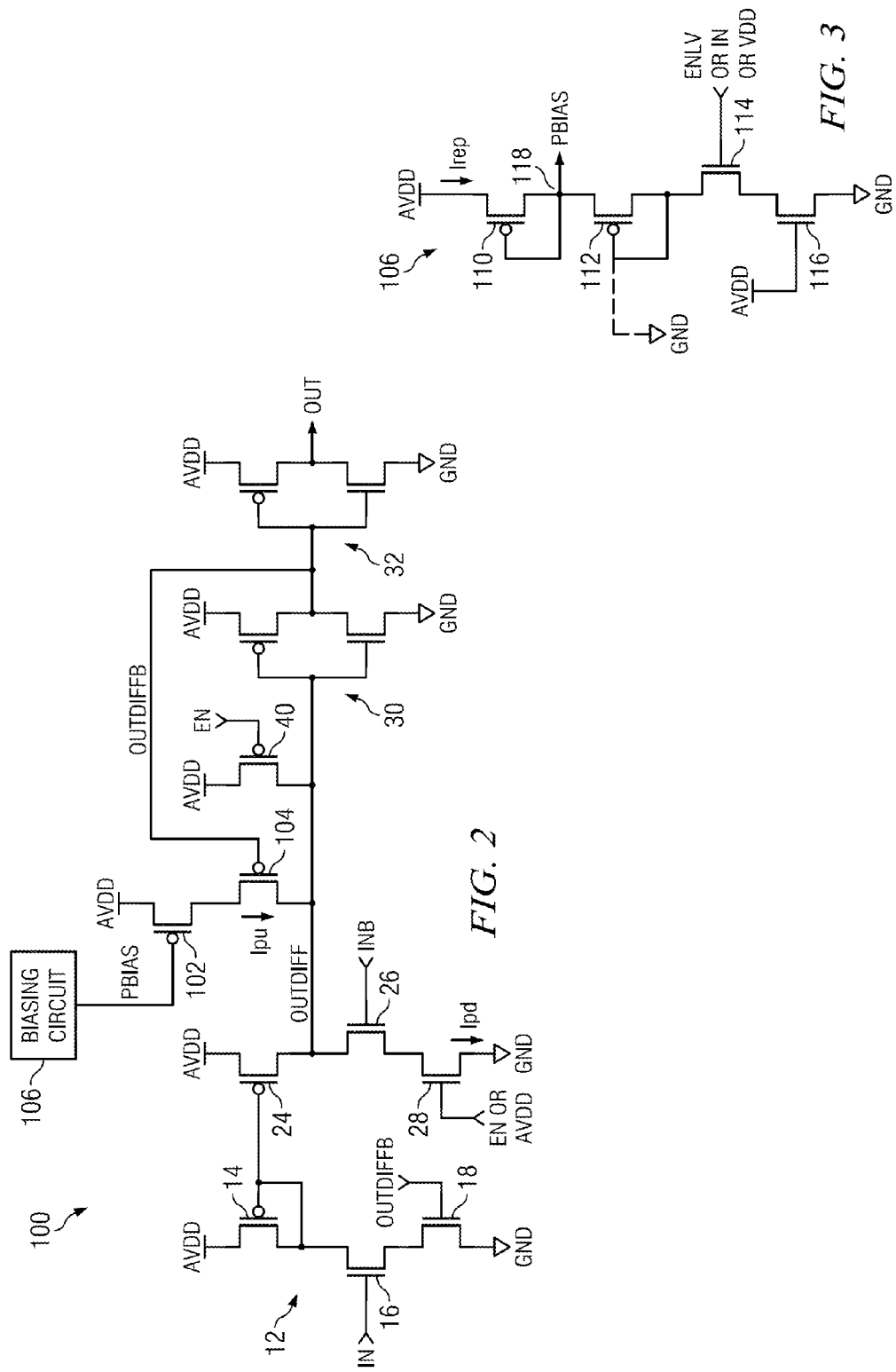

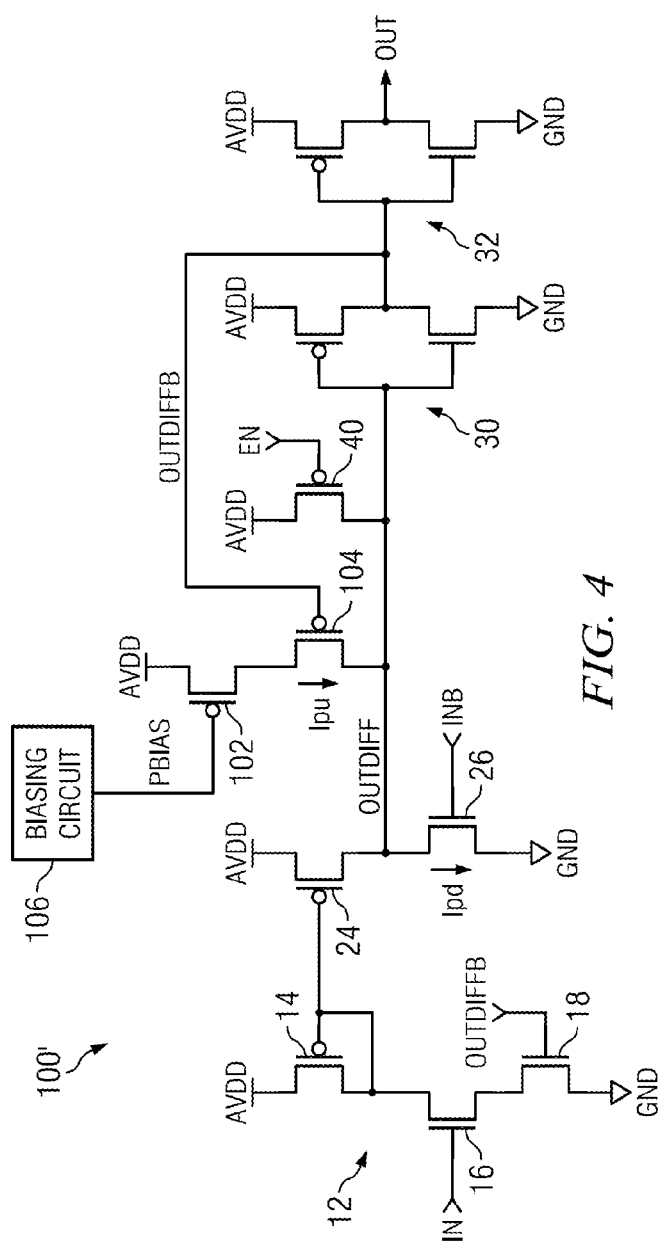
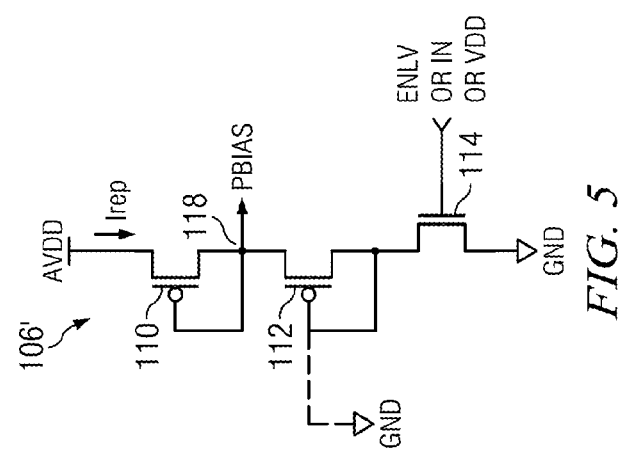
FIG. 4
FIG. 5

LEVEL SHIFTING CIRCUIT WITH ADAPTIVE FEEDBACK

TECHNICAL FIELD

The present invention relates to level shifting circuitry useful in converting or shifting signals between two different voltage domains, and in particular to a low-to-high level shifting circuit.

BACKGROUND

Reference is now made to FIG. 1 which illustrates a circuit diagram of a conventional low-to-high level shifting circuit 10 known to those skilled in the art. The circuit 10 employs an input stage 12 in the form of a differential amplifier which receives a complementary input signal IN/INB at a logic levels referenced to lower voltage supply domain (for example, with logic high at 1V and logic low at ground).

The amplifier includes a first circuit leg formed by series connected transistors 14, 16 and 18, wherein transistor 14 is a p-channel MOSFET and transistors 16 and 18 are n-channel MOSFETs. The source of transistor 14 is coupled to a positive supply node AVDD which receives a higher supply voltage (for example, referenced to a higher voltage supply domain with 5V equal to logic high). The drain of transistor 14 is coupled to the drain of transistor 16. The source of transistor 16 is coupled to the drain of transistor 18, and the source of transistor 18 is coupled to a negative supply node (ground) GND. The gate of transistor 16 is coupled to receive the input signal IN (which, as discussed above, has logic levels referenced to the lower voltage supply domain that is less than the high voltage supply domain at node AVDD). The gate of transistor 18 receives an input signal OUTDIFFB (wherein this signal OUTDIFFB is a feedback signal to be described in more detail below).

The amplifier includes a second circuit leg formed by series connected transistors 24, 26 and 28, wherein transistor 24 is a p-channel MOSFET and transistors 26 and 28 are n-channel MOSFETs. The source of transistor 24 is coupled to the positive supply node AVDD, and the drain of transistor 24 is coupled to the drain of transistor 26. The source of transistor 26 is coupled to the drain of transistor 28, and the source of transistor 28 is coupled to the negative supply node (ground) GND. The gate of transistor 26 is coupled to receive an input signal INB, (which is the complement of signal IN and has logic levels also referenced to the lower voltage supply domain that is less than the higher voltage domain at node AVDD). The gate of transistor 28 receives an input signal EN. In an embodiment, the signal EN is configured as an enable control signal operable to control enabling of circuit 10 operation (i.e., it is an enable signal referenced to the higher voltage supply domain). Alternatively, the gate of transistor 28 is connected to node AVDD.

The gates of transistors 14 and 24 are coupled together and to the drain of transistor 14. Thus, transistors 14 and 24 are connected as a current mirror.

The output of the differential amplifier input stage 12 is taken from the coupled drain nodes of transistors 24 and 26 as a level shifted signal OUTDIFF.

A first CMOS inverter circuit 30 has an input coupled to receive the signal OUTDIFF, and an output generating the feedback signal OUTDIFFB. A second CMOS inverter circuit 32 has an input coupled to receive the signal OUTDIFFB, and an output generating an output signal OUT. The first and second CMOS inverter circuits 30 and 32 are coupled between the positive supply node AVDD and the negative supply node (ground) GND. The output signal OUT (with logic levels referenced to the higher supply voltage domain) is a level shifted up version of the input signal IN (with logic levels referenced to the lower voltage supply domain), for example, level shifting from 1V logic to 5V logic.

The circuit 10 further includes a first pull-up transistor 40 of the p-channel MOSFET type whose source is coupled to the positive supply node AVDD and whose drain is coupled to the output of the differential amplifier input stage 12 (at the coupled drain nodes of transistors 24 and 26 and referenced as signal OUTDIFF). The gate of transistor 40 is coupled to receive the input signal EN (wherein this signal EN is configured as an enable control signal operable to control enabling of circuit 10 operation).

The circuit 10 still further includes a second pull-up transistor 42 of the p-channel MOSFET type whose source is coupled to the positive supply node AVDD and whose drain is coupled to the output of the differential amplifier input stage 12 (at the coupled drain nodes of transistors 24 and 26 and referenced as signal OUTDIFF). The gate of transistor 42 is coupled to the output of the first CMOS inverter circuit 30 and is thus controlled by the signal OUTDIFFB. The pull-up transistor 42 coupled in the circuit 10 as described forms a feedback path.

The feedback path through transistor 42 is required in the circuit 10 in order ensure that the output of the differential amplifier input stage 12 (signal OUTDIFF) is properly pulled up to the voltage at the positive supply node AVDD when the low voltage input signal IN switches from logic low to logic high. In this regard, those skilled in the art understand that transistor 24 is not capable of pulling up the output of the differential amplifier input stage 12 (signal OUTDIFF) to the voltage at the positive supply node AVDD by itself. The transistor 24 is instead capable of pull-up only to an intermediate voltage equal to the voltage at the positive supply node AVDD minus the threshold voltage (vtp24) of transistor 24 (AVDD−vtp24).

An incomplete pull-up of the output of the differential amplifier input stage 12 (signal OUTDIFF) is not desirable because a) large currents will flow in the first and second CMOS inverter circuits 30 and 32, and b) an extended time may be needed for switching the output signal OUT from low-to-high logic level or operational failure may occur where the output signal OUT does not switch logic states at all. The feedback path through transistor 42 addresses the foregoing concerns by providing a pull-up circuit, activated by the signal OUTDIFFB in the logic low state, operable to bring the logic high level OUTDIFF signal fully to the voltage at the positive supply node AVDD.

In order to ensure that the circuit 10 functions properly, the feedback path through transistor 42 must be properly designed. Specifically, the transistor 42, operable as a pull-up path, must be designed to be "weaker" than the pull-down path provided in the second leg of the differential amplifier input stage 12 through n-channel transistors 26 and 28. This is required so that transistor 26, when activated by a logic high level for signal INB, can successfully pull the output of the differential amplifier input stage 12 (signal OUTDIFF) to logic low (ground).

It is difficult to ensure the required strength relationship between the pull-up path and pull-down path across all process (P), voltage (V) and temperature (T) corners. Still further, this task becomes even more difficult with increased differences between the lower voltage supply domain of the input signals IN/INB and the higher voltage supply domain at the positive supply node AVDD (for example, 1V reference for signals IN/INB and AVDD=5V). To ensure full functionality across all PVT corners, those skilled in the art have designed the transistor 42 of the pull-up feedback path to be excessively weak in that the transistor 42 is sized such that its best case strength across the PVT corners is weaker than the worst case strength of the pull-down transistors 26 and 28. However, this design methodology is recognized by those skilled in the art to be overly pessimistic, and circuits designed in this manner tend to operate with an excessively large skew in rise time and fall time and with increased DC current consumption.

Those skilled in the art have further noted, because the transistor 42 of the pull-up feedback path is of the p-channel type and the transistors 26 and 28 of the pull-down path are of the n-channel type, that satisfying the required strength relationship between the pull-up path and pull-down path across all PVT corners becomes even more difficult if the nMOS-pMOS process corners are skewed (for example, fast-slow or slow-fast).

The provision of a weak transistor 42 for the pull-up feedback path is typically accomplished by keeping the W/L ratio of transistor 42 as small as possible. This raises a number of problems. First, it is difficult to ensure a weaker pull-up path than pull-down path across all PVT corners simply by sizing transistor 42. Second, if the W/L ratio of transistor 42 is too small, there is a corresponding increase in level shifting delay and current consumption. Third, it is noted that the pull-down path is formed by high-voltage MOSFETs responding to a low voltage domain signal IN/INB while the pull-up path is formed by a high voltage MOSFET responding to a high voltage domain signal OUTDIFFB. The difference in voltage level of the gate control signals inherently weakens the pull-down path as compared to the pull-up path.

To address the third problem, those skilled in the art have designed level shifting circuits of the type shown in FIG. 1 using low voltage input MOSFETS for the n-channel transistors 26 and 28 in the pull-down path in an effort to make the pull-down path stronger. This solution is not satisfactory because it is difficult to limit voltages at the operating terminals of low voltage MOSFETs to within their operating range during normal functioning and during power-up and power-down.

In another solution, a voltage divider is provided at the gate terminal of transistor 42 to attenuate the feedback control signal DIFFOUTB and try to weaken the pull-up path. This solution, however, cannot ensure correct functionality across all PVT corners.

In yet another solution, special devices such as zero/low threshold voltage MOSFETs have been used for transistors 26 and 28 of the pull-down path. This solution, however, requires special process/fabrication steps, such as the use of extra masks or special layout requirements which are not viable for certain designs and which are ineffective from an area and/or cost perspective.

A need thus exists in the art for an improved level shifting circuit.

SUMMARY

In an embodiment, a circuit comprises: a level shifted signal node; a pull-up path coupled between the level shifted signal node and a first supply node of a higher voltage supply domain, said pull-up path including a first transistor having a first control terminal coupled to receive a feedback signal and a second transistor, coupled in series with the first transistor, having a second control terminal coupled to receive a bias signal; a pull-down path coupled between the level shifted signal node and a second supply node; and a biasing circuit configured to generate the bias signal coupled to the second control terminal.

In an embodiment, a circuit comprises: an amplifier circuit having a first input node, a second input node and an output node; wherein the amplifier circuit further includes: a first pull-up path coupled between a higher voltage supply domain node and the output node, said first pull-up path actuated in response to a first lower voltage supply domain signal at the first input node; a pull-down path coupled between the output node and a ground supply node, said pull-down path actuated in response to a second lower voltage supply domain signal at the second input node; a second pull-up path coupled between the higher voltage supply domain node and the output node, said second pull-up path actuated in response to a feedback signal and biased by a biasing signal; an inverter circuit having an input coupled to the output node and an output generating the feedback signal; and a biasing circuit configured to generate the biasing signal, said biasing circuit configured to ensure that a strength of the second pull-up path is less than a strength of the pull-down path.

In an embodiment, a circuit comprises: a level shifted signal node; a pull-up path coupled between the level shifted signal node and a first supply node and actuated in response to a feedback signal, said pull-up path receiving a biasing signal; a pull-down path coupled between the level shifted signal node and a second supply node; and a biasing circuit configured to generate the bias signal based on a replica current flowing in the biasing circuit, said replica current set to equal a pull-down current in the pull-down path and control a pull-up current in the pull-up path to be smaller than the replica current such that a pull-down strength of the pull-down path exceeds a pull-up strength of the pull-up path.

In an embodiment, a circuit comprises: a level shifted signal node; a pull-up path coupled between the level shifted signal node and a first supply node and actuated in response to a feedback signal, said pull-up path receiving a biasing signal; a pull-down path coupled between the level shifted signal node and a second supply node; and a biasing circuit configured to generate the bias signal based on a replica current flowing in the biasing circuit, said replica current set to equal a pull-up current in the pull-up path and be smaller than a pull-down current in the pull-down path such that a pull-down strength of the pull-down path exceeds a pull-up strength of the pull-up path.

BRIEF DESCRIPTION OF THE DRAWINGS

For a better understanding of the embodiments, reference will now be made by way of example only to the accompanying figures in which:

FIG. 2 is a circuit diagram of an improved low-to-high level shifting circuit;

FIG. 3 is a circuit diagram of a bias voltage generating circuit for the circuit of FIG. 2;

FIG. 4 is a circuit diagram of an alternative embodiment for an improved low-to-high level shifting circuit; and FIG. 5 is a circuit diagram of an alternative embodiment of a bias voltage generating circuit for the circuit of FIG. 4.

DETAILED DESCRIPTION OF THE DRAWINGS

Figure 1:
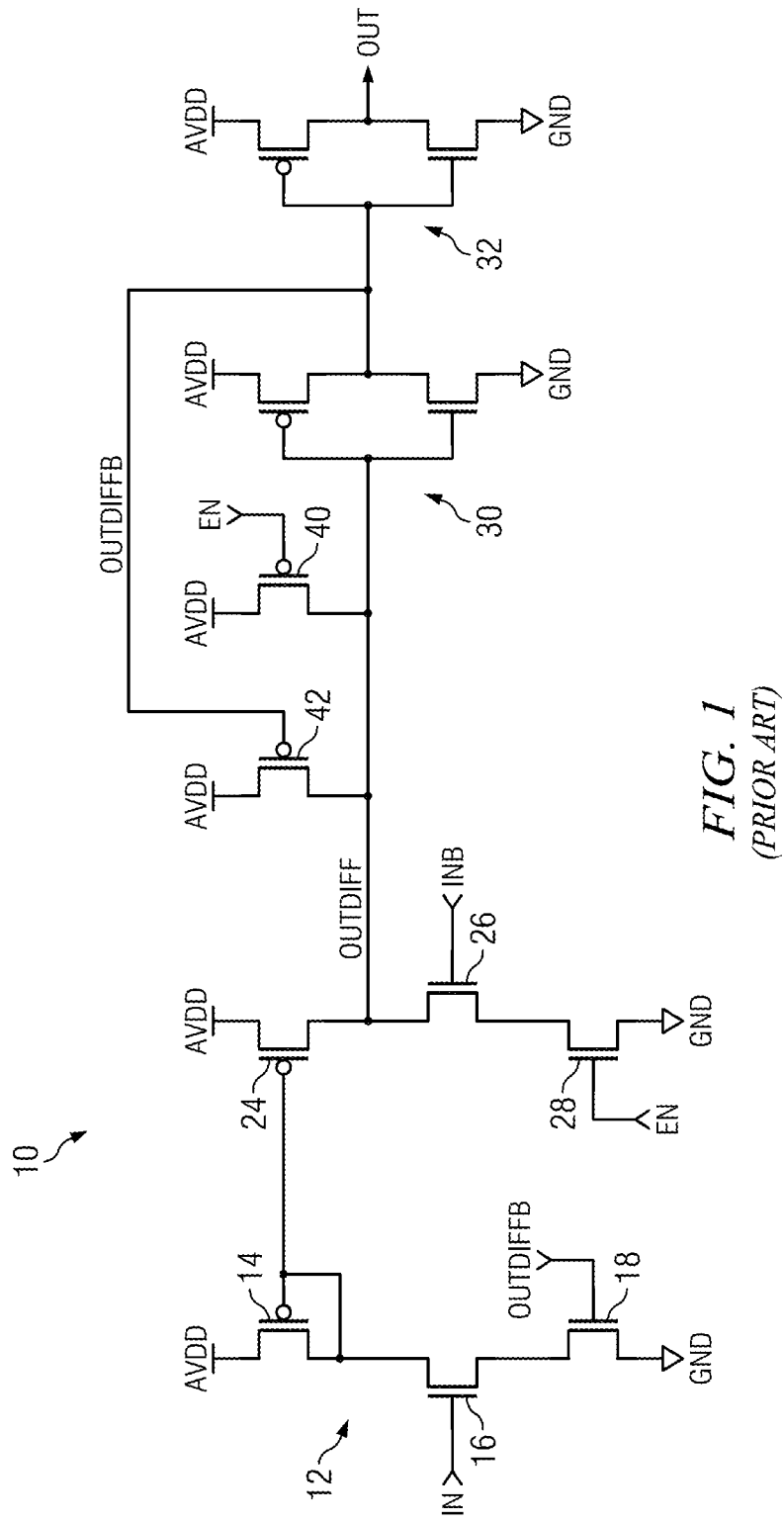
FIG. 1 is a circuit diagram of a conventional low-to-high level shifting circuit.

Reference is now made to FIG. 2 which illustrates a circuit diagram of an improved low-to-high level shifting circuit 100. Like references in FIGS. 1 and 2 refer to like or similar parts. The description of FIG. 1 as set forth above with respect to such like referenced parts is incorporated herein by reference. The description of FIG. 2 below will focus on how the circuit 100 differs from the circuit 10 of FIG. 1.

The circuit 100 utilizes a different feedback path for the pull-up operation than that used by the circuit 10 of FIG. 1. The pull-up transistor 42 of FIG. 1 is replaced by a second pull-up transistor 102 and third pull-up transistor 104 coupled in series between the positive supply node AVDD (a high supply voltage for the higher supply voltage domain) and the output of the differential amplifier input stage 12 (at the coupled drain nodes of transistors 24 and 26 and referenced as signal OUTDIFF). The second and third pull-up transistors 102 and 104 are of the p-channel MOSFET type and define a pull-up path. The source of the second pull-up transistor 102 is coupled to the positive supply node AVDD. The source of the third pull-up transistor 104 is coupled to the drain of the second pull-up transistor 102. The drain of the third pull-up transistor 104 is coupled to the output of the differential amplifier input stage 12 (OUTDIFF). The gate of the first pull-up transistor 102 is coupled to receive a bias signal (PBIAS) generated by a biasing circuit 106. The gate of the second pull-up transistor 104 is coupled to the output of the first CMOS inverter circuit 30 and is thus controlled by the signal OUTDIFFB. The pull-up transistors 102 and 104 coupled in the circuit 100 as described form an adaptive feedback path.

In an alternative embodiment, the gate of transistor 28 may be connected to the node AVDD.

Reference is now made to FIG. 3 which illustrates a circuit diagram of the biasing circuit 106 which generates the bias signal (PBIAS). The biasing circuit 106 is formed by series connected transistors 110, 112, 114 and 116, wherein transistors 110 and 112 are p-channel MOSFETs and transistors 114 and 116 are n-channel MOSFETs. The source of transistor 110 is coupled to the positive supply node AVDD, and the drain of transistor 110 is coupled at node 118 to the source of transistor 112. The output of the biasing circuit 106, producing the bias signal (PBIAS), is taken at node 118. The drain of transistor 112 is coupled to the drain of transistor 114. The source of transistor 114 is coupled to the drain of transistor 116, and the source of transistor 116 is coupled the negative supply node (ground) GND. The gate of transistor 110 is coupled to the drain of transistor 110 at the node 118, and thus the transistor 110 is a diode-connected transistor. The gate of transistor 112 is connected to the drain of transistor 112, and thus the transistor 112 is also a diode-connected transistor.

In an alternative embodiment, the gate of transistor 112 may be connected to the node GND.

The gate of transistor 116 is coupled to the node AVDD in a manner which replicates the connection of the gate of transistor 28 in the amplifier circuit 12 to the enable signal EN.

The gate of transistor 114 is coupled to receive the input signal ENLV. In an embodiment, the signal ENLV is typically used as an enable/disable signal in the lower supply voltage domain of the input signals IN/INB. This accordingly replicates the logic high input signal INB present at the gate of transistor 26. As a result, the gate-to-source voltages of transistors 26 and 114 are set equal to each other, and the current Irep in the biasing circuit 106 is equal to the current Ipd in the amplifier input stage 12.

In an alternative embodiment, the gate of transistor 114 could be coupled to receive the input signal IN. In this configuration, the input signal IN would function as an enable control signal with respect to the biasing circuit 106, with the biasing circuit enabled for operation when the input signal IN is logic high. Use of this configuration is advantageous when the input signals IN/INB are static signals (and thus speed of circuit operation is not a concern). This configuration is further advantageous because it promotes reduced power dissipation through the biasing circuit 106.

In an alternative embodiment, the gate of transistor 114 could be coupled to the low voltage domain supply (for example to VDD).

The biasing circuit 106 is thus configured to replicate exactly the Ipd current pull-down path presented in the amplifier 12 through transistors 26 and 28. So, the current Irep in the biasing circuit 106 is equal to the current Ipd in the amplifier circuit 12. This relationship is ensured by keeping sizing and gate-to-source voltage of transistors 26 and 28 exactly the same as transistors 114 and 116.

With respect to the pull-up path, however, transistor 110 is sized such that transistor 102 is a fraction of the size of transistor 110. For example, transistor 110 may be sized to be a multiple (for example, 3×) of transistor 102. Thus, while the biasing circuit 106 presents an exact replica of the current pull-down path through transistors 26 and 28, it also presents a scaled replica of the pull-up path through transistors 102 and 104 of the circuit 100. With this configuration, the current Ipu in the pull-up path of transistors 102 and 104 is a fraction of the current Irep in the bias circuit 106 (and further is a fraction of the current Ipd in the pull-down path of transistors 26 and 28). Again, this is achieved by making the size of transistor 102 a fraction of the size of transistor 110 and by using transistors 110 and 102 as a mirror circuit (see, the diode connection of transistor 110 in the biasing circuit 106 to drive the gate of transistor 102). The mirroring and ratioing of transistors 110 and 102 as described forces the current Ipu, in an exemplary implementation, to be equal to Irep/3 (and hence Ipd/3) so as to make the pull-up path through transistor 102 and 14 of the circuit 100 weaker than the pull-down path through transistors 26 and 28 of the amplifier 12.

Although the exemplary implementation uses a fraction of one-third, it will be understood that other fractions could be selected depending on circuit need. However, in any implementation the transistor 112 is sized the same as transistor 104, the transistor 114 is sized the same as transistor 26 and the transistor 116 is sized the same transistor 28. Thus, the biasing circuit 106 presents an exact replica the pull-down path of the amplifier 12 through transistors 26 and 28 and further presents a scaled replica of the pull-up path through transistors 102 and 104.

It will be understood that for current replication the primary requirement is that the size of transistors in the pair of transistors 114 and 26 must be the same. The same size configuration for transistors in the pair of transistors 112 and 104 and pair of transistors 116 and 28 is not mandatory, but is preferable. The accuracy of replication of current will be best if all three matched sizing criteria are met.

With the implementation as described above, and the application of PBIAS to bias the operation of the pull-up path through transistors 102 and 104, it is ensured that the pull-up strength through transistors 102 and 104 will always be less than the pull-down strength of the pull-down path through transistors 26 and 28, and that this relationship will be consistently present over all PVT corners.

Operation of the circuit is as follows:

Assume that IN is logic low and INB is logic high (referenced to the lower supply voltage domain). The signal ENLV will also be logic high (referenced to the lower supply voltage domain of the input signals IN/INB). OUTDIFF will be logic low at the ground voltage, OUTDIFFB will be logic high (referenced to the higher voltage supply domain at the positive supply node AVDD), and OUT will be logic low at the ground voltage.

For a transition of IN from logic low to logic high (referenced to the lower supply voltage domain), INB will switch to logic low at the ground voltage. Transistor 24 turns on and brings OUTDIFF up to a voltage of VDD−vtp24. Because INB is logic low, transistor 26 is off and the pull-down path through transistors 26 and 28 is deactivated. The rise in voltage of OUTDIFF will cause first inverter 30 to switch OUTDIFFB to logic low at the ground voltage. This turns on transistor 104 and activates the pull-up path through transistors 102 and 104 to bring OUTDIFF fully up to the higher voltage at the positive supply node AVDD. The second inverter 32 produces a logic high output signal OUT at the higher AVDD voltage domain.

For a transition of IN from logic high (referenced to the lower supply voltage domain) to logic low, INB will switch to logic high (referenced to the lower supply voltage domain). Transistor 26 turns on and activates the pull-down path through transistors 26 and 28. A current Irep equal to current Ipd flows through the biasing circuit 106 to produce the biasing signal PBIAS. The OUTDIFFB signal at this point in time is still logic low, and thus the pull-up path through transistors 102 and 104 is also activated. However, because of the setting of the PBIAS signal by biasing circuit 106 based on the current Irep, the pull-up path through transistors 102 and 104 has a fraction (for example, one-third) of the strength of the pull-down path through transistors 26 and 28. The mirroring of transistors 110 and 102 along with their ratioing as described above ensures that the current Ipu through transistors 102 and 104 is only a fraction (for example, ⅓) of the current Irep through transistor 110. Since the current Ipd through the pull-down path of transistors 26 and 28 is the same as the current Irep, the current in the pull-down path will dominate over the current Ipu in the pull-up path. Again, this is due to the fractional size relationship of transistor 102 to transistor 110. The Ipd current path domination will bring the OUTDIFF signal towards logic low at the ground voltage. The fall in voltage of OUTDIFF causes the first inverter 30 to switch OUTDIFFB to logic high at the higher voltage at the positive supply node AVDD. This turns off transistor 104 and deactivates the pull-up path through transistors 102 and 104 to allow OUTDIFF to fully reach the ground voltage. The second inverter 32 produces a logic low output signal OUT at the ground voltage.

The operation of the circuit advantageously minimizes delays and current consumption and reduces skew between rise and fall delays. The circuit is fully functional across all PVT corners. Additionally, tracking is achieved between the pull-up and pull-down paths, which is particularly useful if the nMOS-pMOS process corners are skewed (for example, fast-slow or slow-fast).

The circuit further allows the circuit designer to quantify and control the relative strengths of the pull-up path and pull-down down path so as to ensure that the pull-up path is always weaker than the pull-down path, and further optimize the relative path strengths for achieving full functionality across all PVT corners. Indeed, full functionality is achieved with the circuit 100 without using an excessively weak pull-up path that would otherwise result in increased level shifting delay and current consumption. The bias voltage signal PBIAS tracks all corner variations of the MOSFETs in the pull-up and pull-down paths, and thus the pull-up MOSFET need not be controlled in the manner of the prior art to be weaker than a worst case pull-down strength.

It will be noted that a design using multiple level shifters requires only a single biasing circuit so that said biasing circuit incurs negligible overhead in terms of area and power.

The circuit 100 is also advantageously useful across a wide range of signal types. For example, where IN and INB are high frequency clock signals, the MOSFETs used with the circuit 100 can be tuned for smaller delays. Conversely, where IN and INB are static signals, the MOSFETs used with the circuit 100 can be kept smaller. In either case, the MOSFETs in the biasing circuit 106 will be set accordingly to implement the scaled replication. Additionally, all devices used in the circuit are standard devices requiring neither additional masks (such as masks for zero/low threshold voltage devices) nor any special layout considerations.

It will be understood that series connected position of transistors 102 and 104 in the pull-up feedback circuit could be switched such that the source of transistor 104 is coupled to the positive supply node AVDD and the drain of transistor 102 is coupled to the output of the differential amplifier input stage 12 (at the coupled drain nodes of transistors 26 and 28 and referenced as signal OUTDIFF).

It will be understood that the signals applied to the gates of transistors 102 and 104 could be swapped such that the gate of transistor 102 receives the OUTDIFFB feedback signal and the gate of transistor 104 receives the bias signal PBIAS. In this configuration, the mirroring would exist between transistors 104 and 110 so the size ratioing discussed above would instead apply to transistors 104 and 110, rather than transistors 102 and 110, and the size of transistor 102 would then equal the size of transistor 112.

The previous discussion focused on providing a circuit where the pull-up current Ipu is a fraction of the bias circuit 106 current Irep (and thus also a fraction of the pull-down current Ipd). It will be understood that instead the circuit could be designed to ensure that the pull-up current Ipu is equal to the bias circuit 106 current Irep, but that the bias circuit current Irep is a fraction of the pull-down current Ipd. This configuration will, like that discussed above, promote a circuit operation where the pull-down current Ipd is dominant. To achieve this implementation, the transistors 114 and 116 are made to be a scaled replica of the transistors 26 and 28. For example, transistors 114 and 116 would be one-third the size of transistors 26 and 28. The current mirror circuit formed by transistors 110 and 102 would have a same sizing.

Reference is now made to FIGS. 4 and 5 which illustrate an alternative embodiment. Like references in FIGS. 2 and 3 refer to like or similar parts. The description of FIGS. 2 and 3 as set forth above with respect to such like referenced parts, including all alternative embodiments and configurations, is incorporated herein by reference. The description of FIGS. 4 and 5 below will focus on how the circuits 100' and 106' differ from the circuits 100 and 106 of FIGS. 2 and 3.

The circuit 100' differs from the circuit 100 in that transistor 28 has been eliminated. In the circuit 100', the source of transistor 26 is connected to ground.

The circuit 106' differs from the circuit 106 in that transistor 116 has been eliminated. In the circuit 106', the source of transistor 114 is connected to ground.

The use of the term "coupled" or the like herein is intended to cover both a direct and indirect connection of circuit elements.

The circuit 100 may alternatively be implemented to support negative logic.

The use of MOSFET devices is only a preferred implementation, it being understood that the circuit could be implemented using other types of transistors.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
    a level shifted signal node;
    a pull-up path coupled between the level shifted signal node and a first supply node of a higher voltage supply domain, said pull-up path configured to generate a pull-up current and including a first transistor having a first control terminal coupled to receive a feedback signal and a second transistor, coupled in series with the first transistor, having a second control terminal coupled to receive a bias signal;
    a pull-down path coupled between the level shifted signal node and a second supply node and configured to generate a pull-down current; and
    a biasing circuit configured to generate the bias signal coupled to the second control terminal;
    wherein the biasing circuit comprises a circuit path conducting a bias current, and
    wherein the pull-up current in the pull-up path is smaller than the bias current and the pull-down current in the pull-down path is greater than or equal to the bias current.

2. The circuit of claim 1, further comprising an amplifier circuit having an input node configured to receive an input signal referenced to a lower voltage supply domain and having an output node comprising the level shifted signal node.

3. The circuit of claim 2, wherein the amplifier circuit is a differential amplifier circuit.

4. The circuit of claim 1, wherein the circuit path comprises:
    a third transistor having a size which matches a size of the first transistor;
    a fourth transistor having a size which is larger than a size of the second transistor;
    wherein a control terminal of the fourth transistor is directly connected to a control terminal of the second transistor;
    wherein the third and fourth transistors are coupled in series at an intermediate node directly connected to the control terminals of the second and fourth transistors; and
    wherein the biasing signal is generated at said intermediate node.

5. The circuit of claim 4,
    wherein the pull-down path includes at least one additional transistor; and
    wherein the circuit path further includes at least one additional replica transistor having a size which matches a size of the at least one additional transistor.

6. The circuit of claim 1,
    wherein the pull-down path includes at least one additional transistor; and
    wherein the circuit path further includes at least one additional replica transistor having a size which is smaller than a size of the at least one additional transistor.

7. The circuit of claim 6, wherein the circuit path comprises:
    a third transistor having a size which matches a size of the first transistor;
    a fourth transistor having a size which matches a size of the second transistor;
    wherein a control terminal of the fourth transistor is directly connected to a control terminal of the second transistor;
    wherein the third and fourth transistors are coupled in series at an intermediate node directly connected to the control terminals of the second and fourth transistors; and
    wherein the biasing signal is generated at said intermediate node.

8. The circuit of claim 1, further comprising a first inverter circuit having an input coupled to the level shifted signal node and an output configured to generate the feedback signal for application to the first control terminal.

9. The circuit of claim 8, further comprising a second inverter circuit having an input coupled to the output of the first inverter circuit and an output configured to generate a level shifted output signal.

10. A circuit, comprising:
    an amplifier circuit having a first input node, a second input node and an output node;
    wherein the amplifier circuit further includes: a pull-down path coupled between the output node and a ground supply node, said pull-down path actuated in response to a lower voltage supply domain signal at the second input node;
    a pull-up path coupled between the higher voltage supply domain node and the output node, said pull-up path actuated in response to a feedback signal and biased by a biasing signal;
    an inverter circuit having an input coupled to the output node and an output generating the feedback signal; and
    a biasing circuit configured to generate the biasing signal, said biasing circuit configured to ensure that a strength of the pull-up path is less than a strength of the pull-down path.

11. The circuit of claim 10, wherein the amplifier circuit is a differential amplifier circuit and the first and second input nodes are complementary input nodes.

12. The circuit of claim 10, wherein the biasing circuit comprises a circuit path conducting a bias current, wherein a pull-up current in the pull-up path is smaller than the bias current and a pull-down current in the pull-down path is equal to the bias current.

13. The circuit of claim 10, wherein the biasing circuit comprises a circuit path conducting a bias current, wherein a pull-up current in the pull-up path is equal to the bias current and a pull-down current in the pull-down path is greater than the bias current.

14. The circuit of claim 10, wherein the pull-up path comprises:
    a first transistor having a first control terminal coupled to receive the feedback signal; and
    a second transistor, coupled in series with the first transistor, having a second control terminal coupled to receive the biasing signal.

15. The circuit of claim 14, wherein the biasing circuit comprises a circuit path including:
    a first replica transistor that is scaled in size to match the first transistor of the pull-up path; and
    a second replica transistor, coupled in series with the first replica transistor, that is scaled in size to be larger than the second transistor of the pull-up path.

16. The circuit of claim 15, wherein the second replica transistor is coupled in series with the first replica transistor at an intermediate node configured to output the biasing signal.

17. The circuit of claim 15,
- wherein the pull-down path comprises an input transistor having a control terminal coupled to the second input node; and
- wherein the circuit path of the biasing circuit comprises a replica input transistor that is scaled in size to match the input transistor of the pull-down path.

18. The circuit of claim 14, wherein the biasing circuit comprises a circuit path including:
- a first replica transistor that is scaled in size to match the first transistor of the pull-up path; and
- a second replica transistor, coupled in series with the first replica transistor, that is scaled in size to match the second transistor of the pull-up path.

19. The circuit of claim 18, wherein the second replica transistor is coupled in series with the first replica transistor at an intermediate node configured to output the biasing signal.

20. The circuit of claim 18,
- wherein the pull-down path comprises an input transistor having a control terminal coupled to the second input node; and
- wherein the circuit path of the biasing circuit comprises a replica input transistor that is scaled in size to be smaller than the input transistor of the pull-down path.

* * * * *